(12) United States Patent
Kim et al.

(10) Patent No.: US 7,880,849 B2
(45) Date of Patent: Feb. 1, 2011

(54) DISPLAY PANEL WITH TFT AND GATE LINE DISPOSED BETWEEN SUB-ELECTRODES OF PIXEL ELECTRODE

(75) Inventors: Chul-Ho Kim, Yongin-si (KR); Kook-Chul Moon, Yongin-si (KR); Pil-Mo Choi, Seoul (KR); Ho-Suk Maeng, Seoul (KR); Sang-Hoon Lee, Seoul (KR); Kyung-Hoon Kim, Uiwang-si (KR); Keun-Woo Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 569 days.

(21) Appl. No.: 11/865,827

(22) Filed: Oct. 2, 2007

(65) Prior Publication Data
US 2008/0121893 A1    May 29, 2008

(30) Foreign Application Priority Data
Nov. 23, 2006    (KR) .................. 10-2006-0116271

(51) Int. Cl.
*G02F 1/1343*    (2006.01)
*G02F 1/136*    (2006.01)

(52) U.S. Cl. .................. 349/144; 349/39; 349/44; 349/47; 257/72

(58) Field of Classification Search ............ 349/44, 349/47, 144, 38, 39; 257/72
See application file for complete search history.

(56) References Cited

U.S. PATENT DOCUMENTS

| | | | |
|---|---|---|---|
| 2005/0162579 A1* | 7/2005 | Jeong et al. | 349/43 |
| 2005/0195353 A1* | 9/2005 | Park et al. | 349/139 |
| 2005/0286003 A1* | 12/2005 | Lee et al. | 349/141 |

* cited by examiner

*Primary Examiner*—Michael H Caley
(74) *Attorney, Agent, or Firm*—F. Chau & Associates, LLC

(57) ABSTRACT

A display panel includes gate lines formed on a substrate, storage electrode lines formed on the substrate and being parallel to the gate lines, data lines insulated from the gate lines and crossing the gate lines, a plurality of thin film transistors (TFTs) connected with the gate lines and the data lines, and pixel electrodes having a first sub-electrode connected with a TFT and a second sub-electrode formed at a side opposite the first sub-electrode with respect to a gate line, wherein the TFT and a storage electrode line are disposed between the first and second sub-electrodes.

24 Claims, 8 Drawing Sheets

DISPLAY PANEL WITH TFT AND GATE LINE DISPOSED BETWEEN SUB-ELECTRODES OF PIXEL ELECTRODE

CROSS-REFERENCE TO RELATED APPLICATION

This application claims priority to and the benefit of Korean Patent Application No. 10-2006-0116271 filed on Nov. 23, 2006, the entire contents of which are incorporated herein by reference.

BACKGROUND OF THE INVENTION (a) Technical Field

The present invention relates to a display panel and, more particularly, to a display panel for a liquid crystal display (LCD).

(b) Discussion of the Related Art

A liquid crystal display (LCD) device, one of the commonly used flat panel displays, includes two display panels on which field generating electrodes such as pixel electrodes and a common electrode are formed, and a liquid crystal layer interposed therebetween. In the LCD device, voltage is applied to the field generating electrodes to generate an electric field in the liquid crystal layer to thereby determine an alignment of liquid crystal molecules of the liquid crystal layer and control polarization of incident light, thereby allowing displaying of images.

In an effort to widen the viewing angle, liquid crystal molecules are aligned to be perpendicular to the upper and lower substrates and cutout patterns are formed on the pixel electrodes and the counter electrodes, and in another method, an electrode is divided into a plurality of sub-electrodes.

In addition, a gate line may be formed to be close to an upper boundary region or a lower boundary region of the pixel electrode for the purpose of increasing an aperture ratio.

SUMMARY OF THE INVENTION

Formation of cutout patterns causes a reduction in aperture ratio by portions corresponding to the cutout pattern, while formation of sub-electrodes also causes a reduction in the aperture ratio due to the existence of a connecting member for connecting the sub-electrodes.

Light leakage may occur in a boundary region of adjacent pixel electrodes since liquid crystal molecules may not be adequately aligned due to opposite directions and different magnitudes of electric field.

The aperture ratio can be reduced due to a light blocking member formed to prevent light leakage.

When the gate line is formed to be close a lower boundary of the pixel electrode, a kickback voltage varies according to a scan direction (e.g., forward and backward), which causes a flicker effect.

That is, when a signal is input to a $(N+1)^{th}$ gate line after the signal is input to an Nth gate line by forward scan, a voltage input to an $N^{th}$ pixel electrode does not affect the signal of the $(N+1)^{th}$ gate line since a distance between the Nth pixel electrode and the $(N+1)^{th}$ gate line is sufficiently far.

However, when the signal is input to a $(N-1)^{th}$ gate line after the signal is input to an $N^{th}$ gate line by backward scan, the voltage input to the $N^{th}$ pixel electrode affects the signal of the $(N-1)^{th}$ gate line since a distance between the $N^{th}$ pixel electrode and the $(N-1)^{th}$ gate line is close, which causes the kickback voltage.

Embodiments of the present invention provide a liquid crystal display (LCD) preventing light leakage, minimizing a reduction in the aperture ratio, preventing a flicker effect caused by a kickback voltage, and providing high luminance in the LCD.

A display panel, according to an exemplary embodiment of the present invention, includes gate lines formed on a substrate, storage electrode lines formed on the substrate and being parallel to the gate lines, data lines insulated from the gate lines and crossing the gate lines, a plurality of thin film transistors (TFTs) connected with the gate lines and the data lines, and pixel electrodes having a first sub-electrode connected with a TFT and a second sub-electrode formed at a side opposite the first sub-electrode with respect to a gate line, wherein the TFT and a storage electrode line are disposed between the first and second sub-electrodes.

The display panel further includes a counter substrate facing the substrate, color filters formed on the counter substrate, and common electrodes formed on the color filters and having a plurality of cutout portions.

The storage electrode line may be positioned between the first and second sub-electrodes.

The TFT may include a gate electrode connected with the gate line, a semiconductor insulated from the gate electrode and overlapping the gate electrode, a source electrode connected with a data line and overlapping the semiconductor, and a drain electrode overlapping the semiconductor and facing the source electrode.

A capacitor may be formed by the drain electrode overlapping the storage electrode line.

The display panel may further include a connecting member that connects the first and second sub-electrodes.

The connecting member may include a protrusion electrically connected with the drain electrode.

The TFTs respectively include a semiconductor formed on the substrate and comprising a channel region and drain and source regions, a gate electrode insulated from the channel region and overlapping the channel region, a source electrode electrically connected with the source region, and a drain electrode electrically connected with the drain region.

The semiconductor may include polycrystalline silicon.

The storage electrode line may include an expanded portion, and the semiconductor may further include a storage capacitor region overlapping the expanded portion.

A capacitor may be formed by the drain electrode overlapping the storage electrode line.

The display panel may further include a connecting member that connects the first and second sub-electrodes, and the connecting member may include a protrusion electrically connected with the drain electrode.

The display panel may further include an auxiliary electrode formed on the substrate and extending parallel to the gate line.

A boundary line of the auxiliary electrode may coincide with an upper boundary line or a lower boundary line of a pixel electrode of adjacent pixel electrodes.

The boundary line of the auxiliary electrode may lie between the upper boundary line and the lower boundary line of the adjacent pixel electrodes.

The same voltage may be applied to the auxiliary electrode and a common electrode.

The gate line and the auxiliary electrode may be made of the same material.

The storage electrode line is positioned on a boundary line between adjacent pixel electrodes.

The storage electrode line may further include a storage electrode that protrudes toward the TFT.

The TFT may further include a gate electrode that is connected with the gate line, a semiconductor that is insulated from and overlaps the gate electrode, a source electrode that is connected with the data line and overlaps the semiconductor, and a drain electrode that overlaps the semiconductor and faces the source electrode. The drain electrode may be connected with a capacitor conductor that overlaps the storage electrode.

The storage electrode may be up-and-down and right-and-left symmetrically formed with respect to the cut-out portion.

The cutout portions may be disposed at positions corresponding to a center of the first sub-electrode and a center of the second sub-electrode.

The cutout portions may have a quadrangle shape with rounded corners or a round shape.

The display panel may further include a light blocking member formed on the counter substrate and disposed between the first and second sub-electrodes.

The first and second sub-electrodes may have a quadrangle shape with rounded corners.

A display panel according to an exemplary embodiment of the present invention includes gate lines formed on a substrate, storage electrode lines formed on the substrate parallel to the gate lines, data lines insulated from the gate lines and crossing the gate lines, a plurality of thin film transistors (TFTs) connected with the gate lines and the data lines, and pixel electrodes having a first sub-electrode connected with a TFT and a second sub-electrode formed at a side opposite the first sub-electrode with respect to a gate line. The gate line is formed between the first and second sub-electrodes.

The storage electrode line may be positioned between two adjacent pixel electrodes.

The display panel may further include a counter substrate facing the substrate, color filters formed on the counter substrate, and common electrodes formed on the color filters and having a plurality of cutout portions.

The storage electrode line may include a storage electrode that protrudes toward the TFT.

The storage electrode may be up-and-down and right-and-left symmetrically formed with respect to the cut-out portion.

The TFT may include a gate electrode connected with the gate line, a semiconductor insulated from the gate electrode and overlapping the gate electrode, a source electrode connected with a data line and overlapping the semiconductor, and a drain electrode overlapping the semiconductor and facing the source electrode. The drain electrode may overlap a capacitor conductor that overlaps the storage electrode.

The pixel electrode may be connected with the capacitor conductor through a contact hole.

The contact hole may overlap the cutout portion.

A boundary line of the storage electrode line may coincide with an upper boundary line or a lower boundary line of adjacent pixel electrodes.

The boundary line of the storage electrode line may lie between the upper boundary line or the lower boundary line of adjacent pixel electrodes.

BRIEF DESCRIPTION OF THE DRAWINGS

The present invention will become more apparent by describing exemplary embodiments thereof in more detail with reference to the accompanying drawings, in which.

DETAILED DESCRIPTION OF EXEMPLARY EMBODIMENTS

Figure 1:
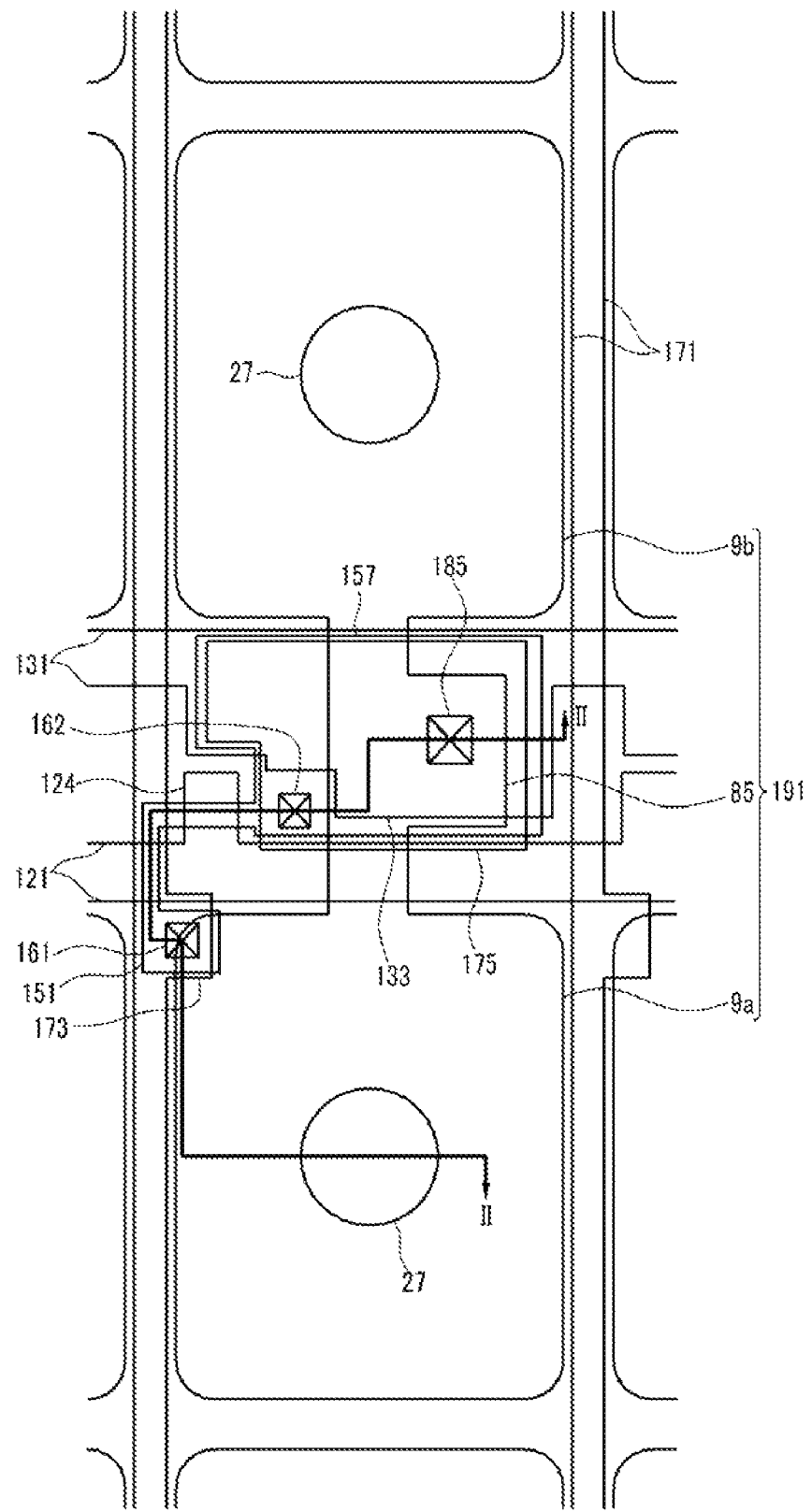
FIG. 1 is a layout view of a liquid crystal display (LCD) according to an exemplary embodiment of the present invention.

Exemplary embodiments of the present invention will be described more fully hereinafter with reference to the accompanying drawings. This invention may, however, be embodied in many different forms and should not be construed as limited to the embodiments set forth herein.

Like reference numerals may designate like elements throughout the specification. It will be understood that when an element such as a layer, film, region, or substrate is referred to as being "on" another element, it can be directly on the other element or intervening elements may also be present. A liquid crystal display (LCD) according to an exemplary embodiment of the present invention will now be described in detail with reference to FIGS. 1 and 2.

Figure 2:
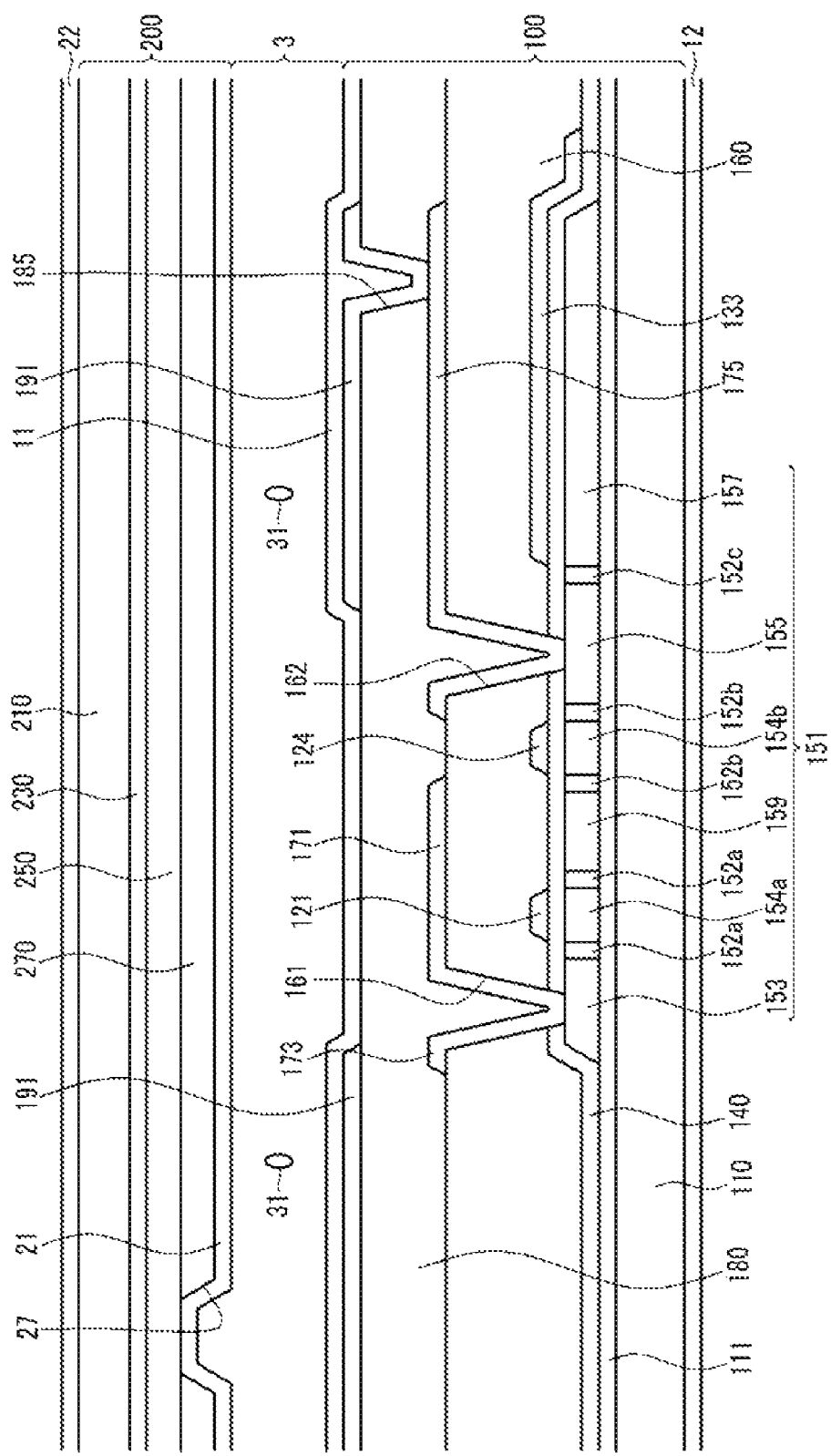
FIG. 2 is a cross-sectional view taken along line II-II of the LCD in FIG. 1.

FIG. 1 is a layout view of a liquid crystal display (LCD) according to one exemplary embodiment of the present invention, and FIG. 2 is a cross-sectional view taken along line II-II of the LCD in FIG. 1.

With reference to FIGS. 1 and 2, the LCD according to the exemplary embodiment of the present invention includes a thin film transistor (TFT) array panel 100, a common electrode panel 200, and a liquid crystal layer 3 interposed between the display panels 100 and 200.

First, the TFT array panel 100 will be described.

A blocking film 111 made of, for example, silicon oxide ($SiO_x$) or silicon nitride (SiNx), is formed on an insulation substrate 110 made of, for example, glass or plastic. The blocking film 111 may have a multi-layered structure.

A plurality of semiconductor islands 151 made of polycrystalline silicon are formed on the blocking film 111. The semiconductor islands 151 include a vertical portion extending in a vertical direction and a horizontal portion connected with the vertical portion and extending in a horizontal direction. End portions of the vertical and horizontal portions may have a large area for a connection with a different layer.

Each semiconductor island 151 includes two channel regions 154a and 154b that are spaced apart from each other. The channel regions 154a and 154b are positioned at the vertical and horizontal portion of the semiconductor islands 151, respectively. The high concentration extrinsic region includes a source region 153, a source/drain region 159, and a drain region 155 respectively separated by the channel regions 154a and 154b. A portion of the drain region 155 extends to form a storage capacitor region 157.

The lightly doped regions 152a and 152b positioned between the heavily doped regions 153, 155, and 159 and the channel regions 154a and 154b are called lightly doped drain (LDD) regions, and have a narrower width compared with other regions.

A lightly doped region 152c can be formed between the storage capacitor region 157 and the drain region 155. When the lightly doped regions 152a and 152b are formed using a separate mask different from a mask for forming the heavily doped regions 153, 155 and 159 and the channel regions 154a, 154b, the lightly doped region 152c is not be formed between the storage capacitor region 157 and the drain region 155.

The lightly doped regions 152a and 152b prevent generation of a leakage current or a punch-through phenomenon in the TFTs, and can be replaced with offset regions without impurities.

A gate insulating layer 140 made of, for example, silicon nitride or silicon oxide is formed on the semiconductor islands 151 and the blocking film 111. The gate insulating layer 140 may have a multi-layered structure.

A plurality of gate lines 121 and a plurality of storage electrode lines 131 are formed on the gate insulating layer 140 and extend substantially in the horizontal direction.

The gate lines 121 transfer gate signals and include a plurality of gate electrodes 124 that protrude, for example, in an upward direction, with respect to the gate lines 121.

A portion of the gate line 121 overlaps the channel region 154a positioned at the vertical portion of the semiconductor island 151, and the gate electrode 124 overlaps the channel region 154b positioned at the horizontal portion of the semiconductor island 151. The portion of the gate line 121 overlapping the channel region 154a positioned at the vertical portion is used as a gate electrode of the TFT.

The storage electrode lines 131 receive a predetermined voltage and include a storage electrode 133 that protrudes, for example, in a downward direction, with respect to the storage electrode lines. The storage electrode 133 overlaps the storage capacitor region 157.

The gate lines 121 and the storage electrode lines 131 can be made of an aluminum-based metal such as aluminum (A) or aluminum alloy, a silver-based metal such as silver (Ag) or silver alloy, a copper-based metal such as copper (Cu) or copper alloy, a molybdenum-based metal such as molybdenum (Mo) or molybdenum alloy, chromium (Cr), tantalum (Ta), or titanium (Ti). Also, the gate lines 121 and the storage electrode lines 131 may have a multi-layered structure including two conductive layers (not shown) each having different physical properties.

An interlayer insulating layer 160 is formed on the gate lines 121, the storage electrode lines 131, and the gate insulating layer 140. The interlayer insulating layer 160 is formed of an organic material with good planarization characteristics and photosensitivity, a low dielectric insulation material such as a-Si:C:O or a-Si:O:F, through plasma enhanced chemical vapor deposition (PECVD), or of an inorganic material such as silicon nitride. The interlayer insulating layer 160 may have a double-layered structure including a silicon nitride (SiNx) film and a silicon oxide (SiO2) film. A plurality of contact holes 161 and 162 exposing the source region 153 and the drain region 155 are formed in the interlayer insulating layer 160 and the gate insulating layer 140.

A plurality of data lines 171 crossing the gate lines 121 and a plurality of drain electrodes 175 overlapping the gate lines 121 are formed on the interlayer insulating layer 160.

Each data line 171 includes a source electrode 173 connected with a source region 153 via the contact hole 161. The drain electrode 175 is spaced apart from the source electrode 173, and can be connected with the drain region 155 via the contact hole 162. The drain electrode 175 overlaps the storage electrode 133 of the storage electrode line 131.

A passivation layer 180 made of an organic material with good planarization characteristics is formed on the data lines 171, the drain electrodes 175, and the interlayer insulating layer 160. The passivation layer 180 can be made of a material with photosensitivity, through photolithography. The passivation layer 180 can be made of a low-dielectric insulation material or less such as, for example, a-Si:C:O and a-Si:O:F, formed through PECVD, or of an inorganic material such as, for example, silicon nitride, or may have a lower layer made of an inorganic material and an upper layer made of an organic material.

The passivation layer 180 has a plurality of contact holes 185 exposing the drain electrodes 175.

A plurality of pixel electrodes 191 made of a transparent conductive material such as, for example, IZO or ITO, or an opaque reflective conductive material such as, for example, aluminum or silver, are formed on the passivation layer 180.

Each pixel electrode 191 includes first and second sub-electrodes 9a and 9b that have a quadrangle shape with rounded corners and are connected by a connecting member 85.

The connecting member 85 includes a vertical portion that connects the first and second sub-electrodes 9a and 9b, and a protrusion for connection with a different layer.

All or substantially all of the gate electrode 124, the gate line 121, the storage electrode 133, the storage electrode line 131, the drain electrode 175, and the semiconductor islands 151 are positioned between the first and second sub-electrodes 9a and 9b.

The protrusion is physically and electrically connected with the drain electrode 175 via the contact hole 185, and receives a data voltage from the drain electrode 175 and transfers the data voltage to the pixel electrode 191.

The pixel electrode 191, to which the data voltage has been applied, generates an electric field together with a common electrode 270 of the common electrode panel 200 which receives a common voltage, to thus determine a direction of liquid crystal molecules of the liquid crystal layer 3 therebetween. Polarization of light that transmits through the liquid crystal layer 3 differs depending on the direction of the liquid crystal molecules. The pixel electrode 191 and the common electrode 270 form a capacitor (referred to as a "liquid crystal capacitor") to maintain the applied voltage even after the TFT is turned off.

A storage capacitor may be additionally formed in order to strengthen the voltage-maintaining capability of the liquid crystal capacitor.

In the exemplary embodiment of the present invention, the storage capacitor is formed such that the storage capacitor region 157 and the storage electrode 133 overlap with the gate insulating layer 140 interposed therebetween. The data voltage inputted from the data line 171 to the pixel electrode 191 is applied to the storage capacitor region 157.

Such formation of the storage capacitor by the storage capacitor region 157 and the storage electrode 133 as in the exemplary embodiment of the present invention, can obtain sufficient storage capacity with only a small area because the gate insulating layer 140 is thinner than an insulating layer formed on a different layer.

In addition, in the present exemplary embodiment, the storage capacitor is formed such that the storage electrode 133 and the drain electrode 175 overlap with the interlayer insulating layer 160 interposed therebetween, and the pixel electrode 191 and the storage electrode 133 overlap with the passivation layer 180 interposed therebetween. The storage capacity formed by these elements is smaller than that formed by the storage capacitor region 157 and the storage electrode 133, which, thus, can be used as an supplemental storage capacitor.

Also, in the present exemplary embodiment, because the gate line 121, the storage electrode line 131, and the TFT are formed at the portion where the connecting member 85 positioned between the first and second sub-electrodes 9a and 9b is formed, the area of the first and second sub-electrodes 9a and 9b that is covered by the gate line 121, the storage electrode line 131, and the TFT is minimized. Accordingly, a reduction of an aperture ratio of the pixel electrode 191 can be minimized.

The common electrode panel 200 will now be described.

A plurality of color filters 230 are formed on an insulation substrate 210 that is made of transparent glass or plastic, and may extend longitudinally in a vertical direction along the column of pixel electrodes 191, thereby forming a stripe. Each color filter 230 can display one of three primary colors of red green, and blue.

Light blocking members (not shown) can be formed at a lower portion of the color filters 230. The light blocking members prevent light leakage between the pixel electrodes 191, and can also be formed between the first and second sub-electrodes 9a and 9b.

In an exemplary embodiment, the light blocking member is not formed at a region corresponding to the gate lines 121. Accordingly, a reduction of the aperture ratio that may be caused by the light blocking member can be reduced.

An overcoat 250 is formed on the color filters 230. The overcoat 250 may be made of an (organic) insulator, and it prevents the color filters 230 from being exposed and provides a planarized surface. The overcoat 250 may be omitted.

The common electrode 270 is formed on the overcoat 250. The common electrode 270 is formed of a transparent conductor such as, for example, ITO or IZO. The common electrode 270 includes a plurality of cutout portions 27. Each cutout portion 27 may have a circular shape or a quadrangle shape with rounded corners, and corresponds to a central portion of the sub-electrodes 9a and 9b.

Alignment layers 11 and 21 are coated on an inner surface of the display panels 100 and 200, and they can be vertical alignment layers. Polarizers 12 and 22 are provided on an outer surface of the display panels 100 and 200, and polarization axes of the two polarizers 12, 22 are perpendicular to each other. In the case of a reflective LCD, one of the two polarizers 12 and 22 can be omitted.

In the present exemplary embodiment, the LCD may further include a phase retardation film (not shown) for compensating for delay of the liquid crystal layer 3. The LCD may further include a backlight unit (not shown) for providing light to the polarizers 12 and 22, the phase retardation film, the display panels 100 and 200, and the liquid crystal layer 3.

The liquid crystal layer 3 has negative dielectric anisotropy, and liquid crystal molecules 31 of the liquid crystal layer 3 are aligned such that their longer axes are substantially perpendicular to the surfaces of the two display panels 100 and 200 in a state in which no electric field is applied thereto. Accordingly, incident light is blocked, without passing through the polarizers 12 and 22.

When the common voltage is applied to the common electrode 270 and the data voltage is applied to the pixel electrodes 191, an electric field substantially perpendicular to the surfaces of the display panels 100 and 200 is generated. Then, in response to the electric field, the liquid crystal molecules 31 change their direction such that their long axes are perpendicular to the direction of the electric field.

The cutout portions 27 of the field generating electrodes 191 and 270 and the sides of the pixel electrode 191 distort the electric field to generate a horizontal component that determines a tilt direction of the liquid crystal molecules 31. The horizontal component of the electric field is substantially perpendicular to the cutout portions and the sides of the pixel electrode. The liquid crystal molecules are angled by the electric field, formed by the four sides of the first and second sub-electrodes 9a and 9b and the cutout portion 27, substantially in four directions. Because the liquid crystal molecules 31 are angled in many directions, the reference viewing angle of the LCD can increase.

Figure 3:
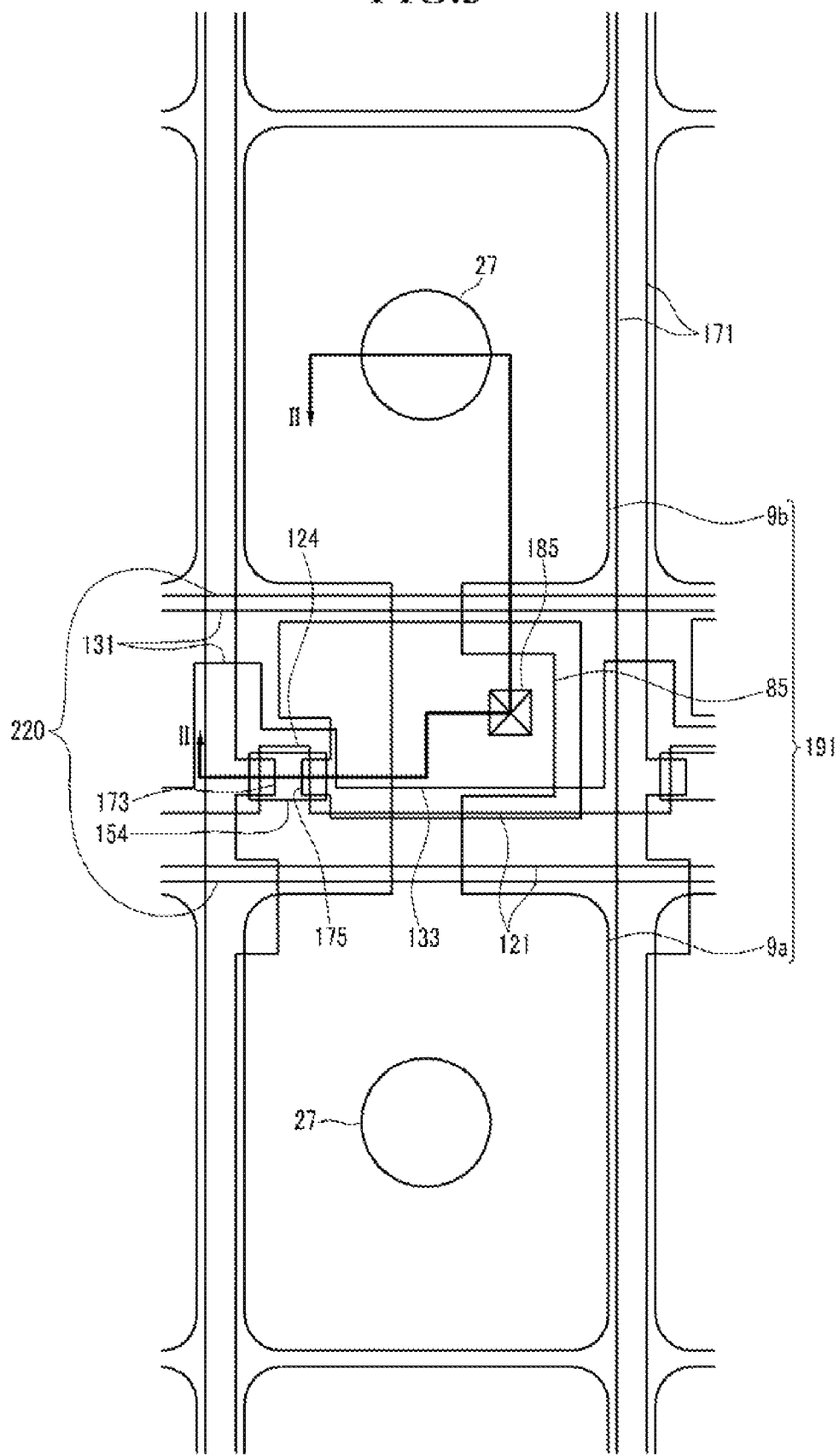
FIG. 3 is a layout view of the LCD according to an exemplary embodiment of the present invention.
Figure 4:
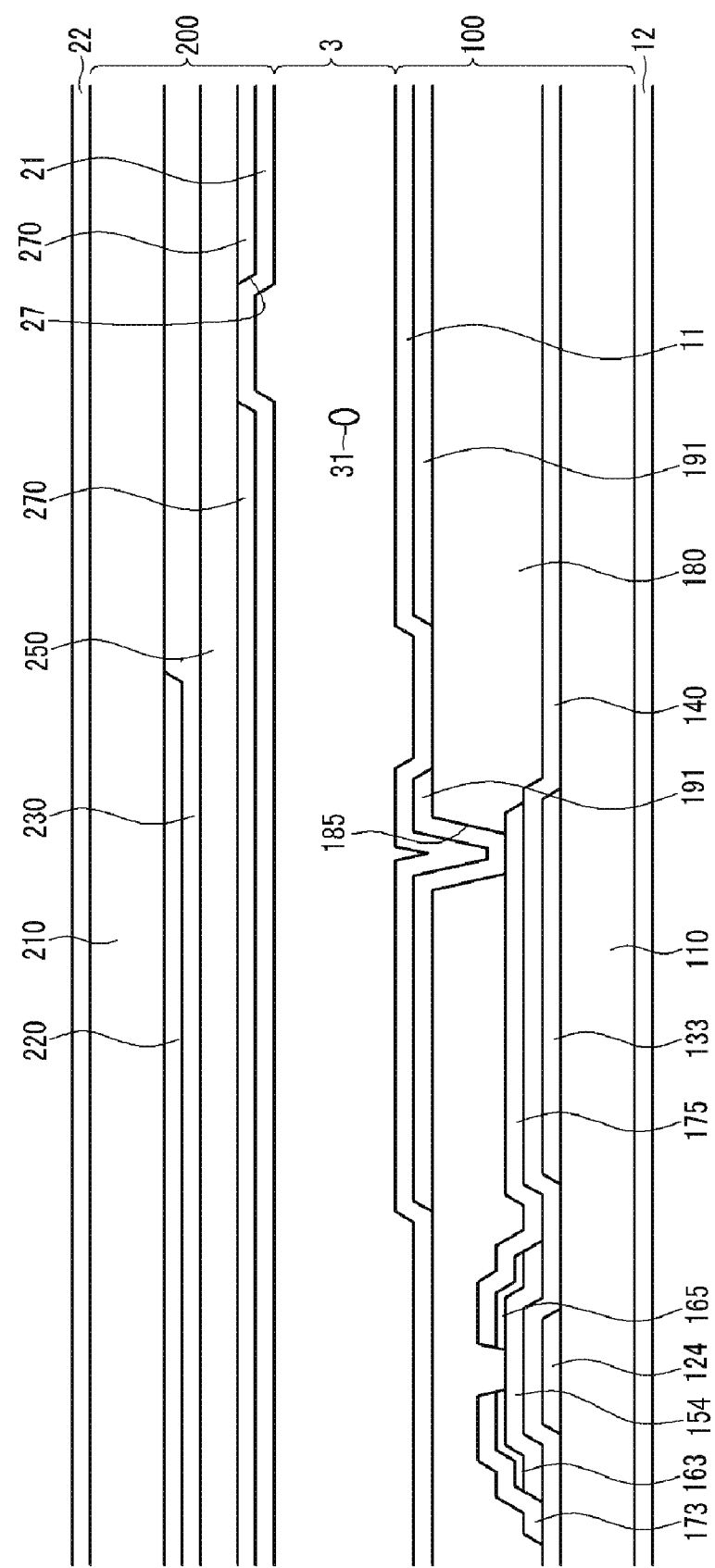
FIG. 4 is a cross-sectional view taken along line IV-IV of the LCD in FIG. 3.

The LCD according to an exemplary embodiment of the present invention will now be described with reference to FIGS. 3 and 4.

The TFT array panel will now be described.

A plurality of gate lines 121 and storage electrode lines 131 are formed on the transparent glass or insulation substrate.

The gate lines 121 transfer gate signals and extend mainly in the horizontal direction. The gate lines 121 include a plurality of gate electrodes 124 protruding therefrom in, for example, an upward direction.

The storage electrode lines 131 receive a predetermined voltage, extend to be substantially parallel to the gate lines 121, and include storage electrodes 133 protruded therefrom in, for example, a downward direction.

The gate lines 121 and the storage electrode lines 131 can be made of the same material as that in the previously embodiment described in connection with FIGS. 1 and 2.

The gate insulating layer 140 made of, for example, silicon nitride (SiNx) or silicon oxide (SiOx), is formed on the gate lines 121 and the storage electrode lines 131.

A plurality of semiconductor islands 154 made of, for example, hydrogenated amorphous silicon (a-Si) are formed on the gate insulating layer 140. The semiconductor islands 154 are positioned on the gate electrodes 124.

Ohmic contact islands 163 and 165 are formed on the semiconductor island 154. The ohmic contact islands 163 and 165 can be made of a material such as n+ hydrogenated amorphous silicon in which N-type impurities such as phosphorous are doped with a high density, or of silicide. The ohmic contact islands 163 and 165 are disposed as pairs on the semiconductor island 154.

The plurality of data lines 171 and the plurality of drain electrodes 175 are formed on the ohmic contact islands 163 and 165 and the gate insulating layer 140.

The data lines 171 transfer data signals and extend mainly in the vertical direction to cross the gate lines 121 and the storage electrode lines 131. The drain electrode 175 is separated from the data line 171 and faces the source electrode 173, wherein the drain and source electrode 175, 173 are centered with respect to the gate electrode 124. The drain electrode 175 extends to overlap the storage electrode 133.

One gate electrode 124, one source electrode 173, and one drain electrode 175 constitute a thin film transistor (TFT) together with the semiconductor island 154, and a channel of the TFT is formed at the semiconductor island 154 between the source electrode 173 and the drain electrode 175.

The data lines 171 and the drain electrodes 175 can be made of the same material as that of the data lines and drain electrodes 175 shown in FIGS. 1 and 2 as described above.

The ohmic contact islands 163 and 165 are formed between the lower semiconductor island 154 and the upper data line 171 and drain electrode 175, in order to lower contact resistance therebetween.

Some portions of the semiconductor island 154 including a portion between the source electrode 173 and the drain electrode 175 are exposed without being covered by the data line 171 and the drain electrode 175.

The passivation layer 180 is formed on the data line 171 and the drain electrode 175, and on the exposed portion of the semiconductor island 154.

The passivation layer 180 may be made of the same materials as that of the embodiment described in connection with FIG. 1 and FIG. 2.

The passivation layer 180 has a plurality of contact holes 185 exposing the drain electrodes 175.

A plurality of pixel electrodes 191 made of IZO or ITO are formed on the passivation layer 180.

Each pixel electrode 191 includes the first and second sub-electrodes 9a and 9b, which have a quadrangle shape with rounded corners. The first and second sub-electrodes 9a and 9b are connected by the connecting member 85.

The connecting member 85 includes a vertical portion that connects the first and second subelectrodes 9a and 9b, and a protrusion for connection with a different layer.

The gate electrode 124, the gate line 121, the storage electrode 133, the storage electrode line 131, the drain electrode 175, and the semiconductor island 154 are positioned between the first and second sub-electrodes 9a and 9b.

The protrusion is physically and electrically connected with the drain electrode 175 via the contact hole 185, and receives a data voltage from the drain electrode 175 and transfers the data voltage to the pixel electrode 191.

In the exemplary embodiment of the present invention, the storage electrode 133 and the drain electrode 175 partially overlap to form a storage capacitor.

The common electrode panel 200 is the same as that in the embodiment described in connection with FIGS. 1 and FIGS. 2.

Hereinafter, an LCD according to another exemplary embodiment of the present invention is described in detail with reference to FIG. 5 and FIG. 6.

Figure 5:
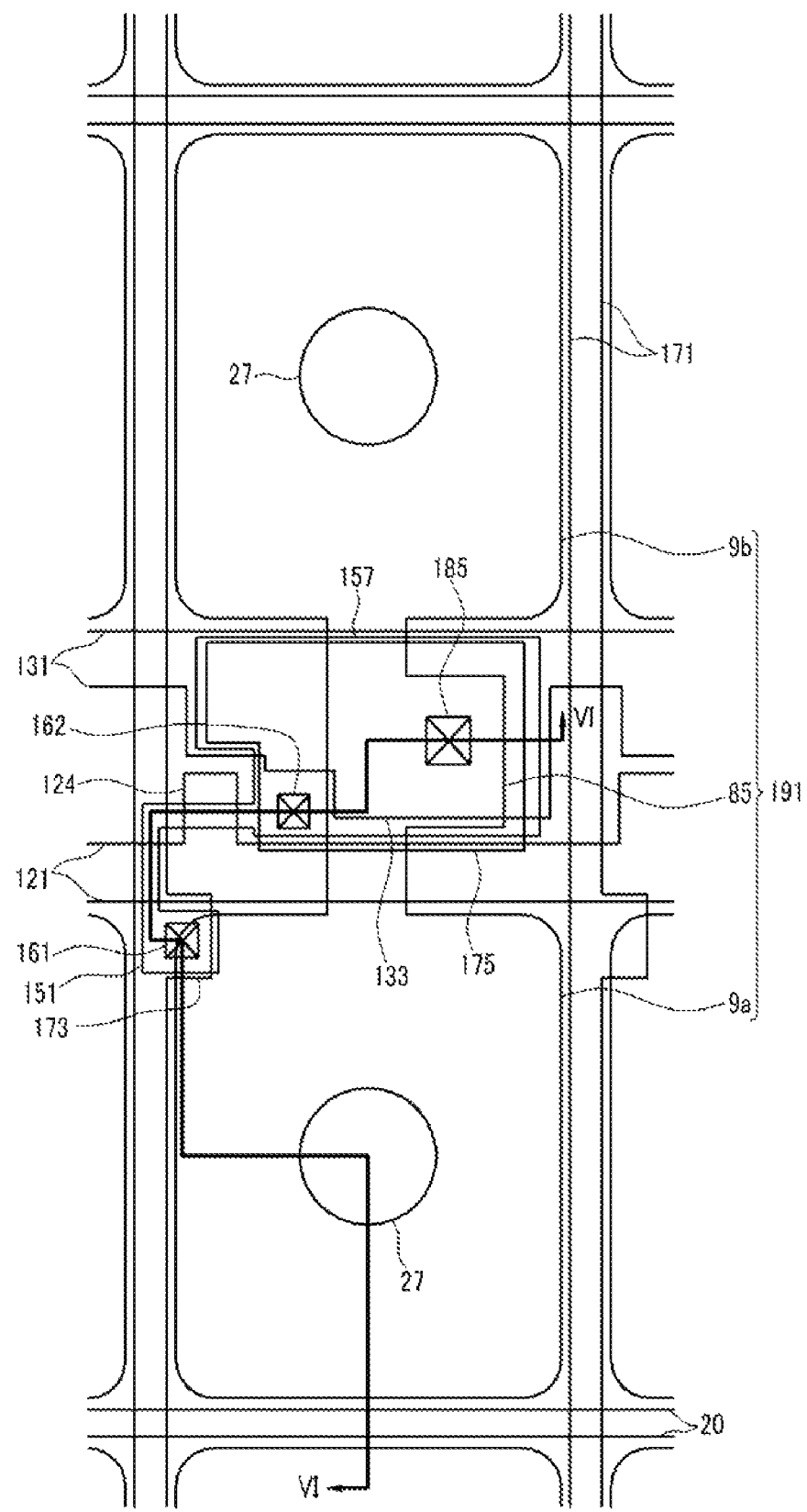
FIG. 5 is a layout view of an LCD according to an exemplary embodiment of the present invention.
Figure 6:
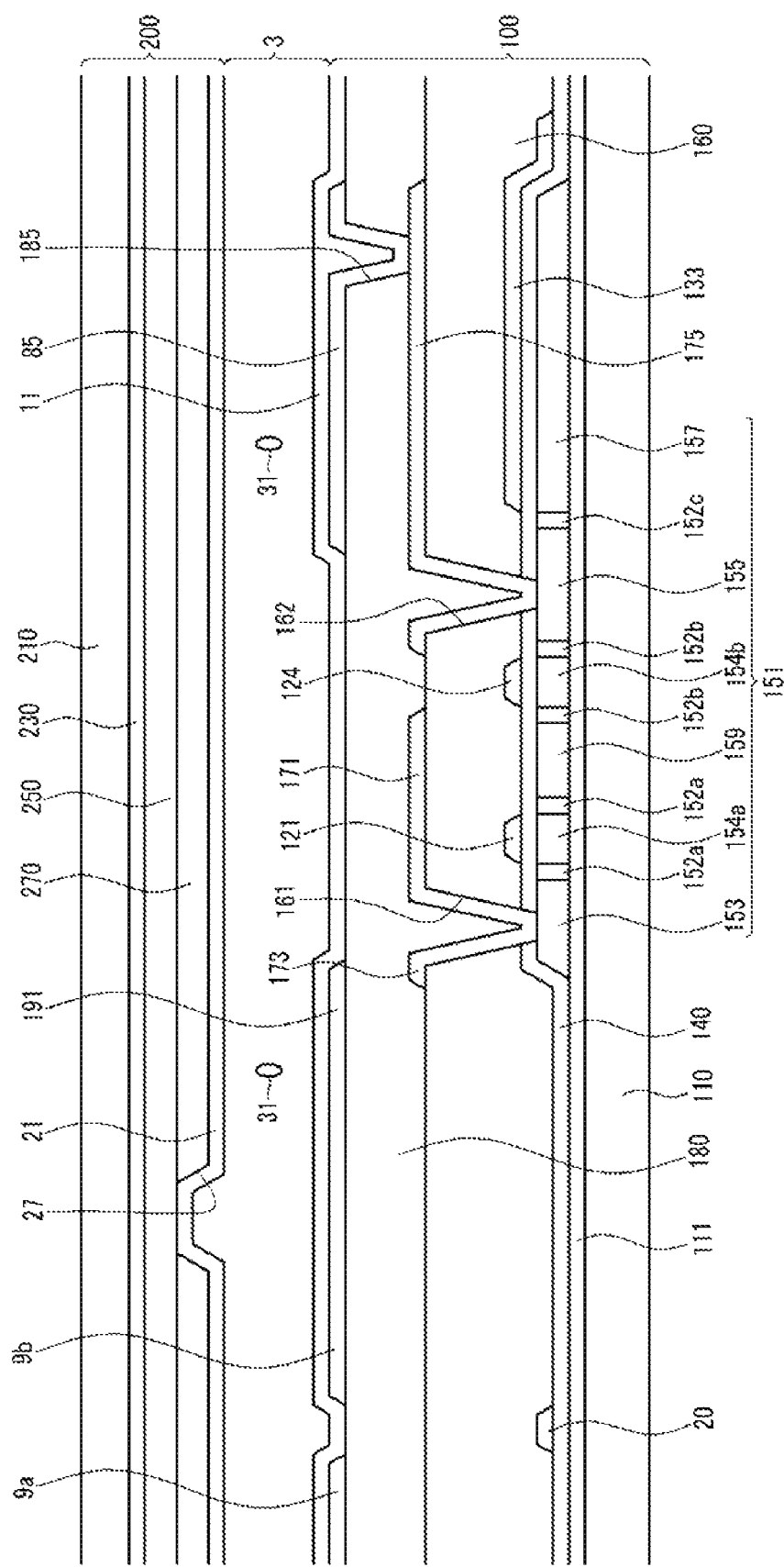
FIG. 6 is a cross-sectional view taken along line VI-VI of the LCD in FIG. 5.

FIG. 5 is a layout view of an LCD according to another exemplary embodiment of the present invention, and FIG. 6 is a cross-sectional view taken along line VI-VI of the LCD in FIG. 5.

Layer structure and arrangement of the LCD according to the exemplary embodiment shown in FIG. 5 and FIG. 6 is substantially the same as have been described in connection with FIG. 1 and FIG. 2, except that, for example, the LCD according to the exemplary embodiment shown in FIG. 5 and FIG. 6 includes a plurality of auxiliary electrodes 20.

Hereinafter, the auxiliary electrodes 20 are described in further detail.

The auxiliary electrodes 20 extend in a direction parallel to the gate lines 121, and are located on a boundary region of adjacent pixel electrodes 191. In order to prevent a decrease of aperture ratio, boundary lines of the auxiliary electrodes 20 are formed such that they coincide with or lie between upper and lower boundary lines of the adjacent pixel electrodes 191.

The auxiliary electrodes 20 are applied with the same voltage as applied to the common electrode 270. The auxiliary electrodes 20 are made of the same material as that of the gate line 121.

When the same voltage is applied to the auxiliary electrode 20 and the common electrode 270, electric field lines that were dense between the common electrode 270 and the pixel electrode 191 are dispersed into a region between the pixel electrode 191 and the auxiliary electrode 20. Therefore, the electric field between the pixel electrode 191 and the common electrode 270 is weakened at the boundary region of the two adjacent pixel electrodes 191.

Therefore, alignment of liquid crystal molecules 31 located in the upper and lower boundary region of the adjacent pixel electrodes 191 changes minimally since the electric field formed between the pixel electrode 191 and the common electrode 270 is weakened. Moreover, the light leakage phenomena, which occurs when the electric field of one pixel affects an adjacent pixel area, is minimally generated.

Furthermore, even if the liquid crystal molecules 31 are not adequately aligned between the upper and lower boundary lines of the adjacent pixel electrodes 191, the light leakage is prevented since the auxiliary electrode 20 works as a light blocking member.

The auxiliary electrode 20 of FIG. 5 and FIG. 6 may be applied to the embodiment described in connection with FIG. 3 and FIG. 4.

The LCD according to an exemplary embodiment of the present invention will now be described with reference to FIG. 7 and FIG. 8.

Figure 7:
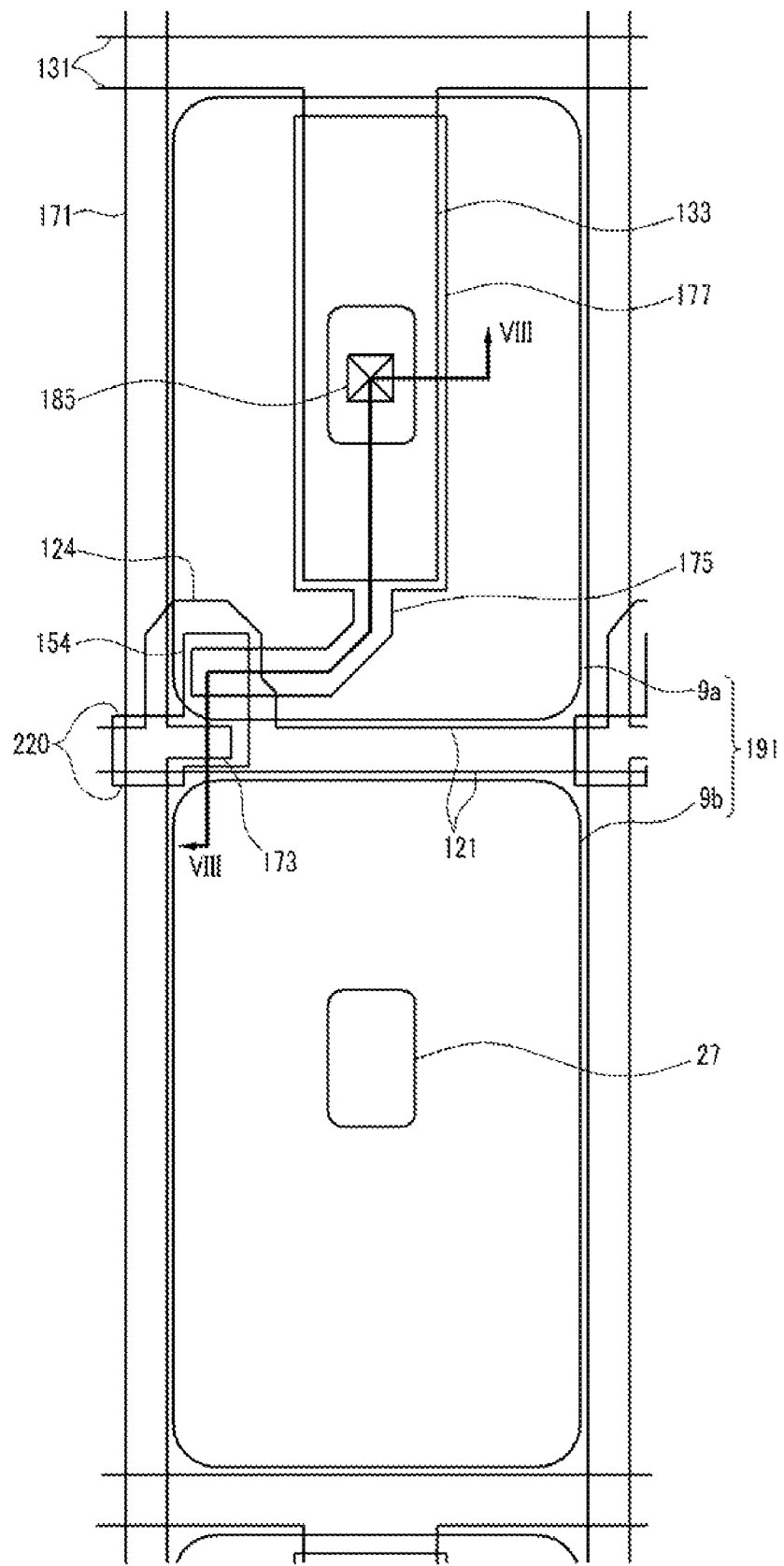
FIG. 7 is a layout view of an LCD according to an exemplary embodiment of the present invention.
Figure 8:
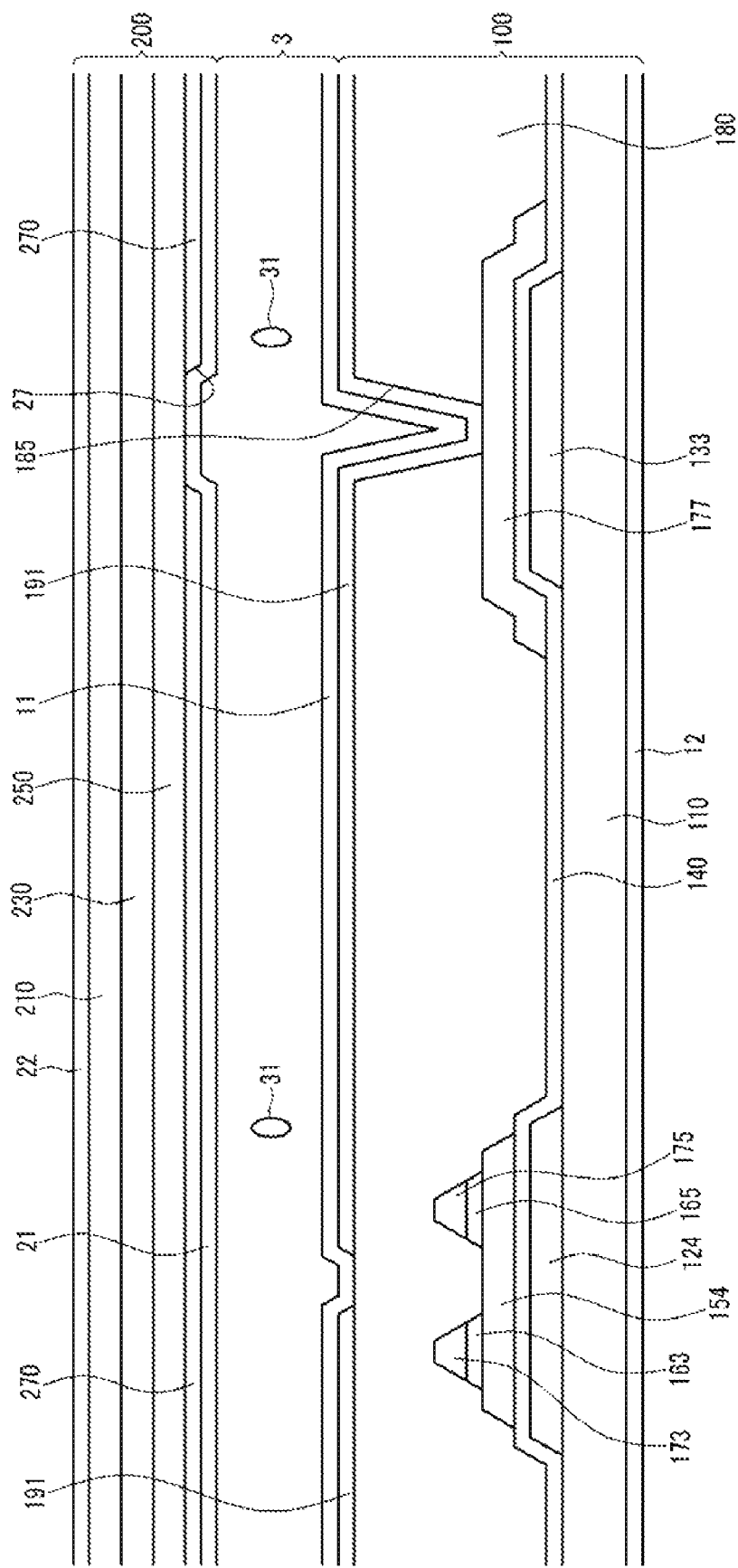
FIG. 8 is a cross-sectional view taken along line VIII-VIII of the LCD shown in FIG. 7.

FIG. 7 is a layout view of an LCD according to an exemplary embodiment of the present invention, and FIG. 8 is a cross-sectional view taken along line VIII-VIII of the LCD shown in FIG. 7.

The layer structure and arrangement of the LCD according to the exemplary embodiment shown in FIG. 7 and FIG. 8 is susbstantially the same as have been described in connection with FIG. 3 and FIG. 4.

The LCD shown in FIG. 7 and FIG. 8 includes a TFT array panel 100 and a common electrode panel 200 that face each other, and a liquid crystal layer 3 interposed between the two panels 100 and 200.

A plurality of gate lines 121 and a plurality of storage electrode lines 131 are formed on a transparent insulating substrate.

The respective gate lines 121 include a plurality of gate electrodes that protrude, for example, in an upward direction, with respect to the gate lines 121, and the respective storage electrode lines 131 extend in parallel with the gate lines 121 and include a storage electrode 133 that protrudes, for example, in a downward direction, with respect to the storage electrode lines 131.

The gate line 121 and the storage line 131 may be formed of the same material as that in the embodiment described in connection with FIGS. 3 and 4.

A gate insulating layer 140 is formed on the gate line 121 and the storage electrode line 131.

A plurality of semiconductor islands 154 are formed on the gate insulating layer 140. The semiconductor islands 154 are positioned on the gate electrodes 124.

Ohmic contact islands 163 and 165 are formed on the semiconductor island 154. The ohmic contact islands 163 and 165 are disposed as pairs on the semiconductor island 154.

A plurality of data lines 171 and a plurality of drain electrodes 175 are formed on the ohmic contact islands 163 and 165 and the gate insulating layer 140. The data lines 171 cross the gate lines 121 and the storage electrode lines 131.

The drain electrode is connected with a capacitor conductor 177, and the capacitor conductor 177 is overlapped with the storage electrode 133.

The data lines 171 and the drain electrodes 175 may be formed of the same material as that of the data lines 171 and the drain electrodes 175 described in connection with FIGS. 3 and 4.

A passivation layer 180 is formed on the data line 171 and the drain electrode 175, and on the exposed portion of the semiconductor island 154.

The passivation layer 180 has a plurality of contact holes 185 exposing the capacitor conductor 177.

A plurality of pixel electrodes 191 are formed on the passivation layer 180. Each pixel electrode 191 includes the first and second sub-electrodes 9a and 9b, which have a quadrangle shape with rounded corners. The first and second sub-electrodes 9a and 9b are connected by the connecting member 85.

The common electrode panel 200 is the same as that in the embodiment described in connection with FIGS. 3 and 4 except that the pixel electrode 191 is connected with the drain electrode 175 that is connected with the capacitor conductor 177 through the contact hole 185. Accordingly, differing from the embodiment described in connection with FIGS. 3 and 4, the connecting member 85 does not include a protrusion part for connecting the drain electrode 175.

In addition, the gate line 121 is positioned between the first and second sub-electrodes 9a and 9b like the embodiment described in connection with FIGS. 3 and 4, but the storage electrode line 131 is positioned on a boundary region of the adjacent pixel electrode 191.

A boundary line of the storage electrode line 131 may be formed such that the boundary line coincides with or lies between upper and lower boundary lines of the adjacent pixel electrode 191, in order to prevent a decrease of aperture ratio. Since the voltage at the common electrode is applied to the storage electrode line 131, a first electric field formed by the pixel electrode 191 offsets a second electric field formed by the common electrode 270 and the pixel electrode 191, and the second electric field is weakened.

Accordingly, alignment of liquid crystal molecules 31 located in the upper and lower boundary region of the adjacent pixel electrodes 191 changes minimally since the first electric field is weakened. The liquid crystal molecules 31 maintain initial alignment, and therefore the light leakage caused by the inappropriate alignment of the liquid crystal molecules 31 may be prevented.

In addition, even if the liquid crystal molecules 31 are not adequately aligned between the upper and lower boundary lines of the adjacent pixel electrodes 191, the light leakage is prevented since the auxiliary electrode 20 works as a light blocking member.

Further, the storage electrode lines 133 are up-and-down and right-and-left symmetrically formed with respect to the cutout portion 27 to increase visibility relating to the viewing angle.

As described above, in the exemplary embodiments of the present invention, by disposing the TFT, the gate line, and the storage electrode line between the sub-electrodes, a region overlapping the pixel electrode can be minimized. Thus, the aperture ratio of the pixel electrodes can increase, and accordingly, the LCD can have high luminance.

In addition, because the light blocking member is formed between the sub-electrodes, a reduction of the aperture ratio that may be caused by the light blocking member can be minimized.

In addition, by employing the auxiliary electrode in the boundary region of the adjacent pixel electrodes, the light leakage due to abnormal behavior of liquid crystal molecules may be prevented without causing a decrease of the aperture ratio.

In addition, since the storage electrode line is positioned on the boundary region of the adjacent pixel electrode, the light leakage caused by the inappropriate alignment of the liquid crystal molecules may be prevented without forming the auxiliary electrode.

In addition, since the first and second sub-electrodes 9a and 9b are symmetrically formed with respect to the gate line, a distances between an $N^{th}$ pixel electrode and a $(N+1)^{th}$ gate lines is the same. Accordingly, since kick-back voltages are the same even when the gate signal is input forwardly or backwardly, a flicker effect may be prevented.

While this invention has been described in connection with exemplary embodiments, it is to be understood that the invention is not limited to the disclosed embodiments, but is intended to cover various modifications and equivalent arrangements included within the spirit and scope of the appended claims.

What is claimed is:

1. A display panel comprising:
    a gate line disposed on a substrate;
    a storage electrode line disposed on the substrate parallel to the gate line;
    a data line insulated from the gate line and crossing the gate line;
    a thin film transistor connected with the gate line and the data line; and
    a pixel electrode having a first sub-electrode connected with the thin film transistor and a second sub-electrode disposed at a side opposite the first sub-electrode with respect to the gate line,
    wherein the thin film transistor, the gate line, and the storage electrode line are disposed between the first sub-electrode and the second sub-electrode.

2. The display panel of claim 1, further comprising:
    a counter substrate facing the substrate;
    a color filter disposed on the counter substrate; and
    a common electrode disposed on the color filter and having a plurality of cutout portions.

3. The display panel of claim 2, wherein the thin film transistor comprises:
    a gate electrode connected with the gate line;
    a semiconductor insulated from the gate electrode and overlapping the gate electrode;
    a source electrode connected with the data line and overlapping the semiconductor; and
    a drain electrode overlapping the semiconductor and facing the source electrode.

4. The display panel of claim 3, wherein a capacitor is formed by the drain electrode overlapping the storage electrode line.

5. The display panel of claim 3, further comprising a connecting member that connects the first sub-electrode and the second sub-electrode.

6. The display panel of claim 5, wherein the connecting member comprises a protrusion electrically connected with the drain electrode.

7. The display panel of claim 2, wherein the thin film transistor respectively comprises:
    a semiconductor formed on the substrate and comprising a channel region and a drain region and a source region;
    a gate electrode insulated from the channel region and overlapping the channel region;
    a source electrode electrically connected with the source region; and
    a drain electrode electrically connected with the drain region.

8. The display panel of claim 7, wherein the semiconductor includes polycrystalline silicon.

9. The display panel of claim 7, wherein the storage electrode line comprises an expanded portion, and the semiconductor further comprises a storage capacitor region overlapping the expanded portion.

10. The display panel of claim 7, wherein a capacitor is formed by the drain electrode overlapping the storage electrode line.

11. The display panel of claim 7, wherein a connecting member includes a protrusion electrically connected with the drain electrode.

12. The display panel of claim 2, further comprising an auxiliary electrode formed on the substrate and extending parallel to the gate line.

13. The display panel of claim 12, wherein a boundary line of the auxiliary electrode coincides with an upper boundary line or a lower boundary line of a pixel electrode of adjacent pixel electrodes.

14. The display panel of claim 12, wherein a boundary line of the auxiliary electrode lies between the upper boundary line and the lower boundary line of adjacent pixel electrodes.

15. The display panel of claim 12, wherein the same voltage is applied to the auxiliary electrode and a common electrode.

16. The display panel of claim 12, wherein the gate line and the auxiliary electrode are made of the same material.

17. The display panel of claim 2, wherein the storage electrode line is positioned on a boundary line between adjacent pixel electrodes.

18. The display panel of claim 17, wherein the storage electrode line further includes a storage electrode that protrudes toward thin film transistor.

19. The display panel of claim 18, wherein the thin film transistor further comprises:

agate electrode connected with the gate line;

a semiconductor insulated from and overlapping the gate electrode;

a source electrode connected with the data line and overlapping the semiconductor; and a drain electrode overlapping the semiconductor and facing the source electrode, wherein the drain electrode is connected with a capacitor conductor overlapping the storage electrode.

20. The display panel of claim 18, wherein the storage electrode is up -and-down and right-and-left symmetrically formed with respect to the cut-out portion.

21. The display panel of claim 2, wherein the cutout portions are disposed at positions corresponding to a center of the first sub-electrode and a center of the second sub-electrode.

22. The display panel of claim 21, wherein the cutout portions have a quadrangle shape with rounded corners or a round shape.

23. The display panel of claim 2, further comprising a light blocking member formed on the counter substrate and disposed between the first sub-electrode and the second sub-electrode.

24. The display panel of claim 1, wherein the first sub-electrode and the second sub-electrodes have a quadrangle shape with rounded corners.

* * * * *